United States Patent [19]

Tachikawa

[11] Patent Number: 5,329,359
[45] Date of Patent: Jul. 12, 1994

[54] PARTS MOUNTING INSPECTION METHOD

[75] Inventor: Jin Tachikawa, Hino, Japan

[73] Assignee: Canon Kabushiki Kaisha, Tokyo, Japan

[21] Appl. No.: 883,699

[22] Filed: May 15, 1992

[30] Foreign Application Priority Data

May 17, 1991 [JP] Japan .................. 3-112815
Apr. 21, 1992 [JP] Japan .................. 4-100979

[51] Int. Cl.$^5$ .......................................... G01B 11/00
[52] U.S. Cl. ...................... 356/398; 356/394
[58] Field of Search .................. 356/394, 398

[56] References Cited

U.S. PATENT DOCUMENTS

| | | | |
|---|---|---|---|
| 3,909,602 | 9/1975 | Micka | 356/398 X |
| 4,269,515 | 5/1981 | Altman | 356/394 |
| 4,674,869 | 6/1987 | Pryor et al. | 356/394 X |
| 4,906,099 | 3/1990 | Casasent | 356/394 |
| 4,929,845 | 5/1990 | Amin et al. | 356/394 X |
| 4,978,224 | 12/1990 | Kishimoto et al. | 356/394 |
| 5,032,735 | 7/1991 | Kobayashi et al. | 356/394 X |
| 5,076,697 | 12/1991 | Takagi et al. | 356/394 X |
| 5,103,105 | 4/1992 | Ikegaya et al. | 356/394 X |
| 5,166,753 | 11/1992 | Tokura | 356/394 |

Primary Examiner—Jill A. Johnston
Assistant Examiner—Milton I. Cano
Attorney, Agent, or Firm—Fitzpatrick, Cella, Harper & Scinto

[57] ABSTRACT

An inspection method for inspecting the posture of parts mounted on a circuit board. This method consists of providing a moving unit for moving a stage holding the circuit board, a light source for irradiating the parts with a laser beam, an optical system path for irradiating the parts with the laser beam, a signal output path for outputting a reference signal by the laser beam, and a processing unit to process a signal from the optical system and signal output paths. In this method, reference signals A and B are obtained at first and second positions of the parts. This method further involves holding the parts at a first position, irradiating the optical system and signal output paths with the laser beam to detect a signal from each path, and outputting from the processing unit a first phase difference signal, corresponding to the first position, of output from each path. The parts are moved to the second position by the moving unit, and there the optical system and signal output paths are irradiated by the laser beam, with signals detected from each path, and the processing unit outputs a second phase difference signal, corresponding to the second position, of output from each path. The method further consists of judging the posture of the parts by comparison of the A and B reference signals and the first and second phase difference signals.

3 Claims, 12 Drawing Sheets

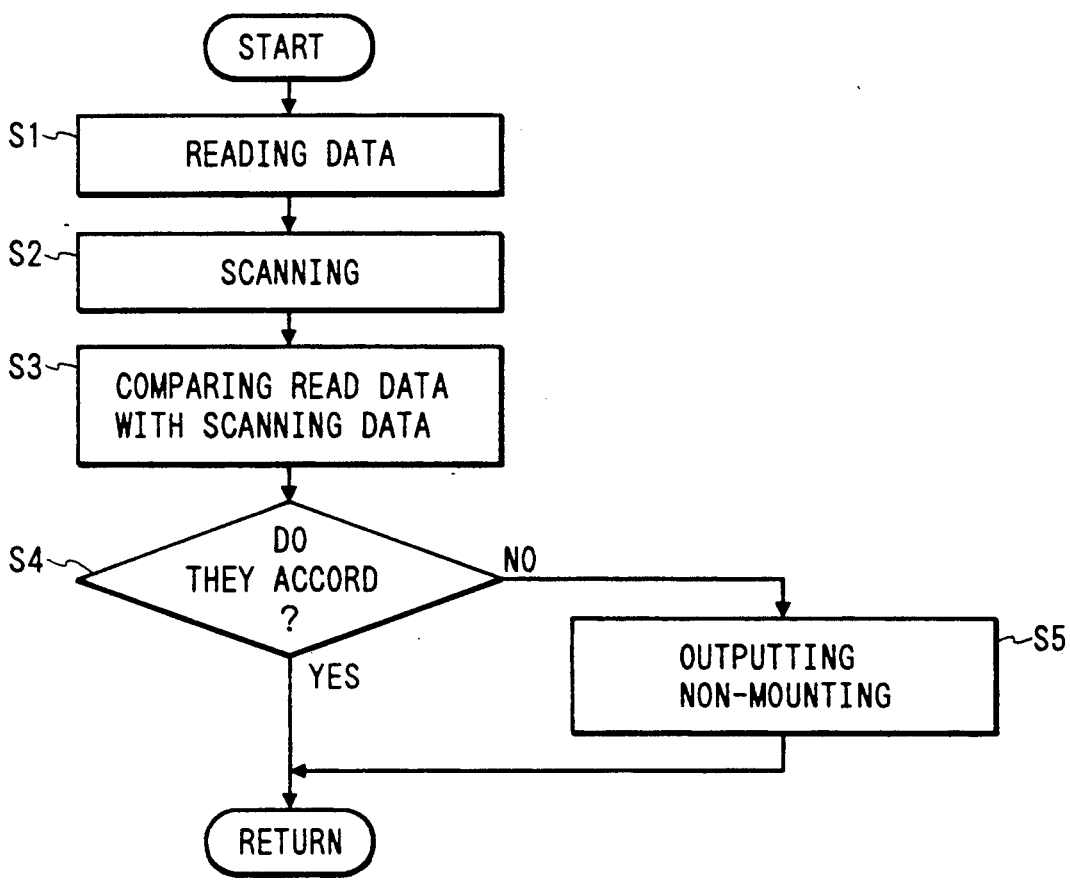

NORMAL

ABNORMAL

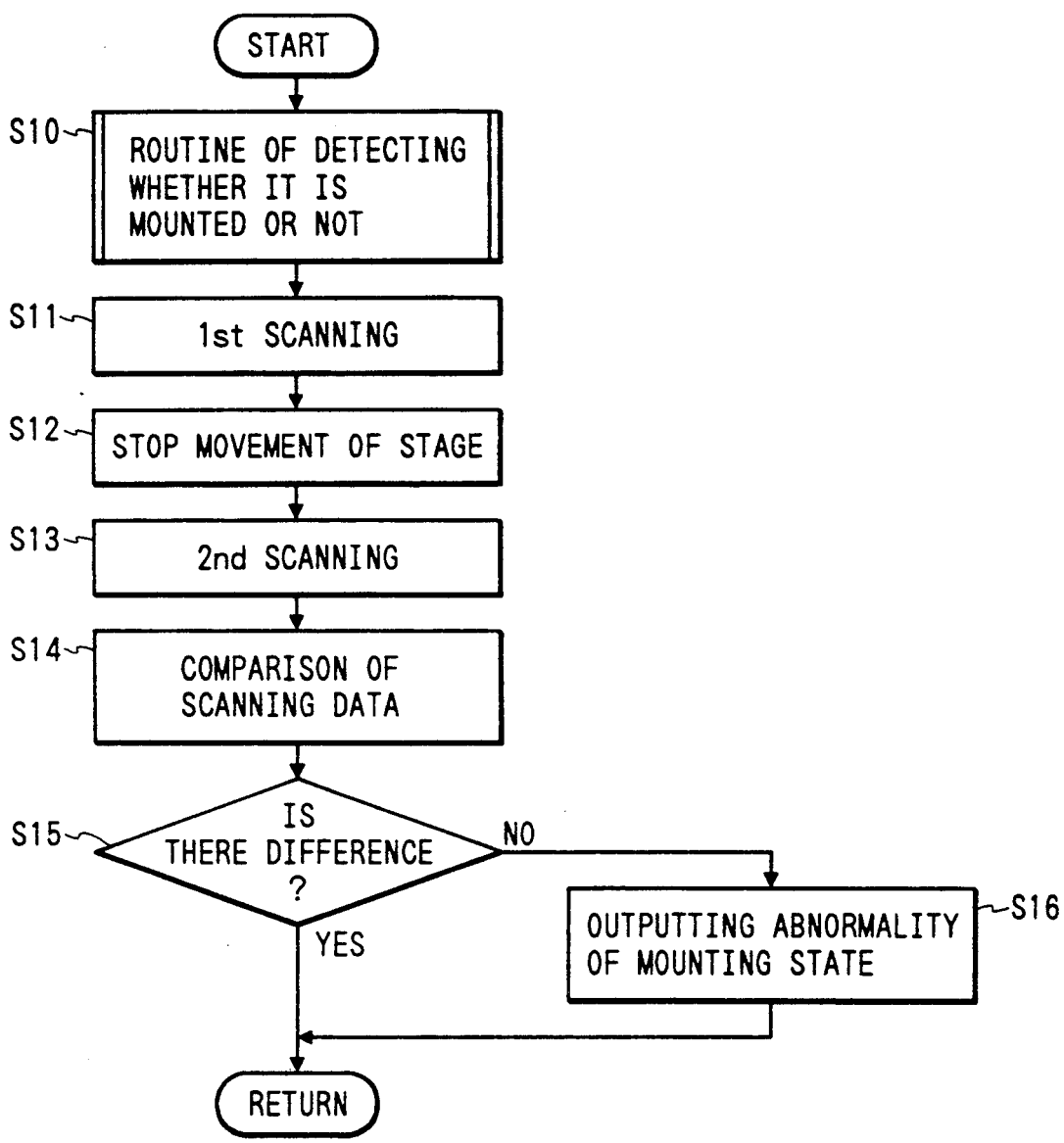

PARTS MOUNTING INSPECTION METHOD

BACKGROUND OF THE INVENTION

1. Field of the Invention

The present invention relates generally to a parts mounting inspection apparatus, an inspection apparatus thereof and a board inspected by the same apparatus and, more particularly, to a technology of automatically inspecting existence or non-existence and mounting states of respective parts mounted on a printed circuit board or a hybrid IC.

2. Related Background Art

A trigonometrical measuring method based on a light spot method and a light cutting method as an applied method thereof have hitherto been often utilized for automatically checking mounting states of electronic parts mounted on the printed circuit board or the hybrid IC.

An explanation for the prior art will be given with reference to the drawings. FIG. 12 is a diagram showing a measurement principle of the trigonometrical measuring method based on the conventional light spot method. As illustrated in FIG. 12, a convergent laser beam 18 is incident vertically on a part 15 mounted on a printed circuit board 6 from a laser output unit (LD) 2 to form a spot on the part 15.

This spot beam in turn forms an image on a PSD 17 after being transmitted through an image forming optical system 16. Based on the trigonometrical measuring principle, the height of the part 15 in a predetermined position is determined. Such a measuring operation is repeated a predetermined number of times by relatively scanning the printed circuit board with the laser beams, thereby inspecting the existence or non-existence and a mounting posture of the part 15 on the printed circuit board 6.

In the above-mentioned conventional example, however, the following problems arise, because it is based on the trigonometrical measuring method. To be specific, referring to FIG. 12, i.e., the diagram of assistance in explaining the principle of the trigonometrical measuring method:

(1) The PSD sensor 17 and an incidence optical axis 18 must have a predetermined angle or greater, and hence there are constraints in terms of mounting intervals of the parts and heights because of the impossibility of avoiding a dead angle caused especially by a taller part 19 provided in the vicinity of the part 15:

(2) A measuring circuit automatically judges the center of the spot beam or the maximum reflecting position as a spot irradiating position, and it is, therefore, impossible to perform a precise check because of an error in the measurement value if a density difference exists due to an existence of a print display unit within the spot beam range: and (3) The PSD sensor 17 and the incidence optical axis 18 must have the predetermined angle or greater, and hence the distances between the part 15 to be checked, the sensor 17 and the optical system have to be made close to some extent.

SUMMARY OF THE INVENTION

Accordingly, it is a primary object of the present invention, which has been devised in the light of the above-described problems, to provide a parts mounting inspection method, an inspection apparatus thereof and a board capable of setting a small distance between parts and a device without constraints in terms of mounting intervals of the parts and heights and also causing errors in measurement values even when a density difference exists.

To solve the foregoing problems and accomplish the object, according to one aspect of the present invention, there is provided a parts mounting inspection method for automatically inspecting the existence or non-existence and a mounting state of parts which have been mounted and/or are to be mounted on a board, comprising the steps of: causing a control means to store mounting state data after mounting the part to be mounted on the board; obtaining height detection data of the part by relatively moving the board with respect to a laser intensity modulation distance measurement type measuring means connected to the control means to obtain a distance variation by irradiating the board and the part with laser beams intensity-modulated at a high frequency 10 substantially in parallel to use a phase variation of a reflected light after irradiation; and performing the automatic inspection by comparing the detection data with the mounting state data.

Further, preferably, in the method, the relative movement is effected at least twice for every part, and an abnormal state of a posture of the part is automatically inspected.

Further, preferably in the method, the relative movement is effected at least once for every part, and the existence or non-existence is automatically inspected.

Further, preferably, in the method, the relative movement is effected at least once for every part, and a floating state of the part with respect to the board is automatically inspected.

Further, preferably, in the method, the parts are surface mounting type electronic circuit parts each assuming a predetermined external configuration such as a rectangular parallelopiped or circular shape or provided with a lead wire, and a parts mounting inspection is performed.

Further, preferably in the method, the automatic inspection is effected on both or any one of the top and lower surfaces of the board before or after a soldering process of the part.

According to another aspect of the invention, there is provided a parts mounting inspection apparatus for automatically inspecting the existence or non-existence and a mounting state of parts which have been mounted and/or are to be mounted on a board, comprising: a control means for storing mounting state data after mounting the part to be mounted on the board and executing predetermined control operations; a laser intensity modulation distance measurement type measuring means, connected to the control means to obtain a distance variation by irradiating the board and the part with laser beams intensity-modulated at a high frequency substantially in parallel from a laser output unit to use a phase variation of a reflected light after irradiated; and a moving means, connected to the control means to relatively move the board surface with respect to the measuring means in a direction substantially orthogonal to an axis of the laser beam. The distance variation is obtained by use of the phase variation in the intensity of the irradiation reflected beam, thereby automatically inspecting the existence or non-existence and the mounting state of the part which has been mounted and/or is to be mounted on the board on the basis of the comparison with the data of the mounting state and the existence or non-existence of the part.

Further, preferably, in the apparatus, the measuring means includes a laser beam scanning unit and scans the board surface in a horizontal direction, and the moving means includes a driving unit and drives the board surface in a vertical direction at predetermined intervals to thereby make the board surface scannable vertically and horizontally, thereby performing the automatic inspection.

Further, preferably, in the apparatus, an optical system for irradiating the laser beams of the measuring means substantially in parallel is disposed a predetermined distance away from the board to reduce a shadow influence caused by edges of the part, thereby performing the automatic inspection.

Besides, preferably, the apparatus is constructed so as to detect a phase variation of a reflected beam after said laser beam is irradiated, said reflected beam, the reflected beam incident on said board and said part and the laser beam emitted from said laser output unit have a partial common light path, and the apparatus further comprises a first detection unit for converting the reflected beam of the laser beams into a first electric signal, a second detection unit for detecting and converting the reflected beam into a second electric signal, and a phase variation unit for applying a phase having a difference of a predetermined angle to said electric-signal.

Moreover, preferably, the apparatus further comprises an output means for outputting a result of the automatic inspection, thereby performing an image output of the automatic inspection result.

According to still another aspect of the invention, there is provided a board having parts which have been mounted thereon and/or are to be mounted thereon, an existence or non-existence and mounting state of which are automatically inspected, wherein mounting state data after mounting the part to be mounted on the board is stored in a control means; height detection data of the part is obtained by relatively moving the board with respect to a laser intensity modulation distance measurement type measuring means, connected to the control means to obtain a distance variation by irradiating the board and the part with laser beams intensity-modulated at a high frequency substantially in parallel to use a phase variation of the reflected beam after irradiated; and an automatic inspection is effected by comparing the detection data with the mounting state data.

Further, preferably, in the board, the relative movement is effected at least twice for every part, and an abnormal state of a posture of the part is automatically inspected.

Further, in the board, the relative movement is effected at least once for every part, and the existence or non-existence is automatically inspected.

Further, preferably, in the board, the relative movement is effected at least once for every part, and a floating state of the part with respect to the board is automatically inspected.

Further, preferably, in the board, the parts are surface mounting type electronic circuit parts each assuming a predetermined external configuration such as a rectangular parallelopiped or circular shape or provided with a lead wire, thereby automatically inspecting the mounting state.

Further, preferably, in the board, the automatic inspection is effected on both or any one of the top and lower surfaces of the board before or after a soldering process of the part.

BRIEF DESCRIPTION OF THE DRAWINGS

Other objects and advantages of the present invention will become apparent during the following discussion taken in conjunction with the accompanying drawings, in which:

FIG. 2 is a flowchart showing a detection of an existence or non-existence of parts;

FIG. 4 is a flowchart showing the detection of the mounting state of the part;

DETAILED DESCRIPTION OF THE PREFERRED EMBODIMENTS

The preferred embodiment of the present invention will hereinafter be described in detail with reference to the accompanying drawings.

Figure 1:
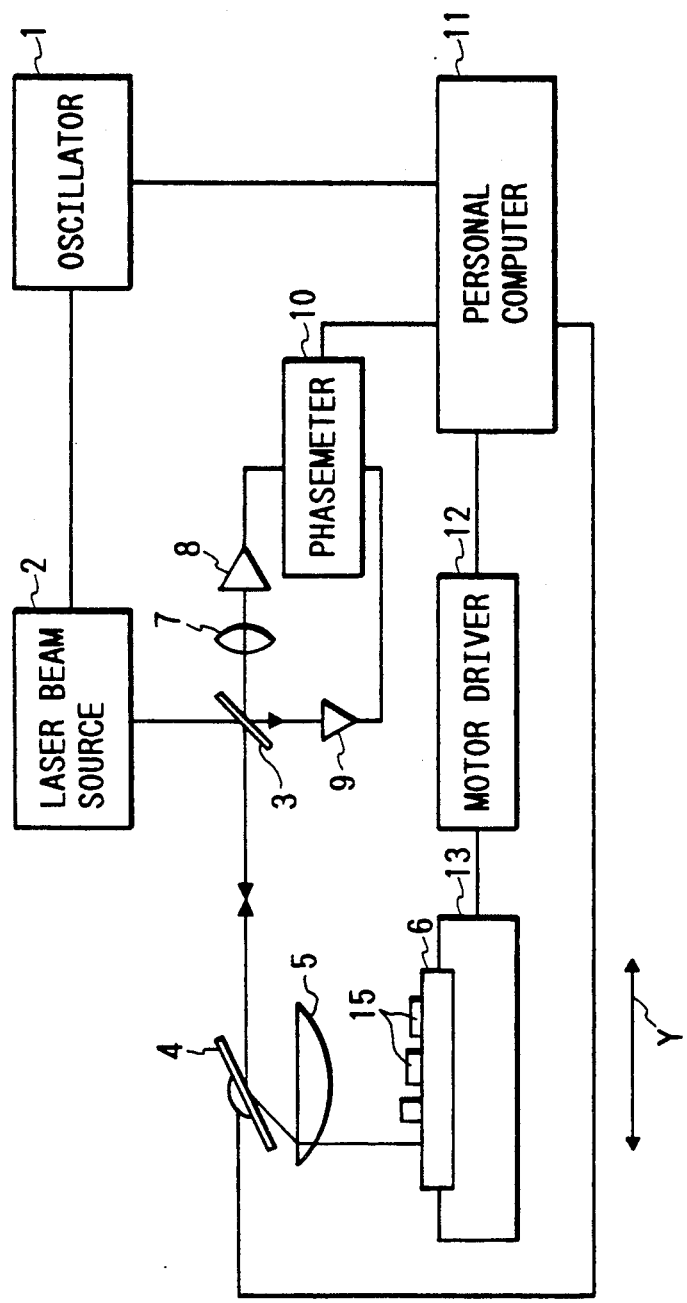
FIG. 1 is a block diagram illustrating a parts mounting inspection apparatus in a first embodiment.

FIG. 1 is a schematic block diagram showing a first embodiment. Connected to an oscillator 1 for generating a high frequency is a laser beam source 2 for emitting a semiconductor laser beam. The laser beam emitted from the laser beam source 2 is split in two directions by means of a beam splitter 3 for splitting a beam of light. The horizontal laser beam of the split beams travels towards a galvano mirror 4 having a structure for angular scanning. This galvano mirror 4 is connected to a personal computer 11 and effects a scan in accordance with a command from the personal computer 11.

The laser beam reflected by the galvano mirror 4 is irradiated on a printed circuit board 6 which will be or has been mounted with parts 15 defined as measurement objects, through an Fθ lens for converging the beams into parallel beams. Further, this printed circuit board 6 is fixedly mounted on a stage 13 connected to a motor driver 12 for driving stepwise in direction Y of the Figure. The motor driver 12 is connected to the personal computer 11 and effects the step driving (in the direction Y) in response to the command from the personal computer 11.

On the other hand, an output of the downward travelling beam of the laser beams split in the two directions by the beam splitter 3 is directed to a high-speed photo diode 9 whose output is inputted to a phasemeter 10. Besides, the laser beams reflected by the galvano mirror 4 toward the printed circuit board 6 are reflected on the parts 15. The reflected laser beam pass through the beam splitter 3 and are incident on the high-speed photo diode 8 via a lens 7. Outputs thereof are inputted to the phasemeter 10, whereby an output difference (phase difference) from the high-speed photo diode 9 is measured. A height of the part 15 is thus measured.

The personal computer 11 for controlling the whole measurement system is connected to this phasemeter 10, and the control which will be mentioned later is performed.

The following is an explanation of a distance measurement based on a laser intensity modulation method for measuring the height of the part 15 by measuring the above-described output difference (phase difference).

In the distance measurement based on the laser intensity modulation method, variations in distance are obtained by using phase variation in intensity when the high frequency intensity-modulated laser beam impinges on an object and returns therefrom. According to the characteristic of this method, a circuit having a lower frequency property than by a TOF (Time of Flight) method is usable, the TOF method obtaining the distance variations by measuring the changes themselves in the time of flight till the pulse beam impinges on the object and returns. For this reason, this method has often been employed in recent years.

Further, this laser intensity modulation method is suited particularly to the measurement of a near distance, because the phase is repeated through every 360 degrees, and this is not so resistive against noises as the TOF method.

The principle of the laser intensity modulation method will be explained by use of general equations. It is assumed that the laser beam having an intensity modulation frequency f and a light phase speed c is branched off in two travelling paths; and l, L are the lengths of the two travelling paths. A difference D between the distances is given by:

$$D = L - l \qquad (1)$$

Change in the phase difference after travelling along these two paths is $2\pi\phi$, and hence:

$$\phi = \frac{f}{c} D \qquad (2)$$

Therefore, where the variation is shown by $\Delta$, a relation of the variation is given by:

$$\frac{\Delta\phi}{\phi} = \frac{\Delta f}{f} + \frac{\Delta D}{D} \qquad (3)$$

In general, the frequency f is fixed, therefore, $\Delta f = 0$. $\Delta D$ is determined by obtaining $\Delta\phi$. Namely, from the formula (3), $\Delta D$ is given by:

$$\begin{aligned} \Delta D &= \frac{D}{\phi} \Delta\phi \\ &= \frac{c}{f} \Delta\phi \\ &= \lambda \Delta\phi \end{aligned} \qquad (4)$$

where $\lambda$ is the distance at which the light travels during one period, i.e., the wavelength. Thus, the distance variation $\Delta D$ is obtained from the wavelength and the phase variation $\Delta\phi$.

Further, in the formula (3), $\phi$ is made constant instead of fixing f, and $\Delta D$ is also obtainable by measuring $\Delta f$.

Namely, from the formula (3), the following formula will be established:

$$\Delta D = \left[ \frac{\Delta\phi}{\phi} - \frac{\Delta f}{f} \right] D \qquad (5)$$

At this time, if the frequency f is controlled so that $\Delta\phi = 0$, the result is given by:

$$\Delta D = -\frac{\Delta f}{f} D \qquad (6)$$

In the formula (6), the distance difference D is preferably small in order to improve an accuracy of $\Delta D$. Because of a constraint of circuitry, however, $\Delta f$ can not be made large in the great majority of cases. Especially, changes in the amplifier group delay characteristic and changes due to the gain frequency dependency often cause problems. Therefore, the distance difference D is changed depending on the circuit characteristics.

Based on this method in which the phase difference is fixed, when a necessary dynamic range is smaller than the wavelength $\lambda$, the frequency variation $\Delta f$ may be small, and an inexpensive circuit is applicable.

It has hitherto been considered that these methods are not applicable to the positional measurement of small chip part because of accuracy as bad as approximately 1 cm. In recent years, however, semiconductor laser, high frequency parts, and phase measurement parts can be speeded up and reduced in prices. As in the embodiment, those methods are also utilizable for measuring the positions of the chip parts.

In the above-described construction, the phasemeter 10 measures a phase difference between a high frequency signal photoelectrically converted by the high-speed photo diode 8 and a high frequency signal photoelectrically converted by the high-speed photo diode 9. An indicative value of the phase difference is taken into the personal computer 11.

The personal computer 11 obtains a high measurement value from the frequency of the laser beam intensity modulation as well as from the variation of the phase difference. The personal computer 11 corrects the height measurement value from correction constants such as a previously obtained offset value, a circuit characteristic and optical characteristic in accordance with the accuracy required, thereby obtaining the height variation of the part. The personal computer 11 judges an existence or non-existence and a posture of the part on the basis of a previously programmed judgment criteria.

If the next measuring point measured in this manner is in an unscannable area only by rotations of the galvano mirror 4, the personal computer 11 gives a command to the motor driver 12 to operate the stage 13. The printed circuit board 6 is shifted to a laser beam scannable point relative to the galvano mirror 4.

Such an operation is repeated a necessary number of times, thereby making it possible to automatically measure and inspect the existence or non-existence, posture and mounting accuracy of the desired part.

The following is a description of one operational example of inspecting both the existence or non-existence of the part and a mounting state of the part. The existence or non-existence of the part is the biggest defect in terms of mounting, and such defect comes out most frequently. However, in the case of the measuring method capable of measuring the height of the part 15 without the dead angle as described above, the inspection of the existence or non-existence of the part is simply attainable.

More specifically, the substantial center of the predetermined part packaging position is irradiated with the laser beam by scanning the stage 13 and the galvano mirror 4. A distance to the irradiated point is measured. If there is no difference in excess of an error range of the distance measuring device between the distance up to a distance measuring device which is defined as a pre-mounting height of the printed circuit board 6 in the mounting position and a post-packaging height, it can be judged that the parts are not yet mounted. If there is no difference in excess of the error range with respect to the height of the mounting part, it can be judged that the parts have been mounted. If neither the former nor the latter is valid, it can be judged that there exist some errors in the board 6 and the parts 15.

The pre-mounting height of the printed circuit board 6 is measurable beforehand for each product board. However, the data may be held in the personal computer 11 by measuring only one typical sample.

FIG. 2 is a flowchart showing the control executed by previously inputting the typical sample data in the personal computer. The typical sample data are read in step S1 before and after starting the inspection. Subsequently in step S2, the laser beam scan is effected, and the scan data are temporarily taken into, e.g., a RAM area of the personal computer 11. Then, a comparison with the sample data is carried out. (step S3)

If this comparative results are coincident, it is judged that the part exists, and the operation moves to a check of the next mounting position. Whereas if not coincident in step S4, a message indicating non-mounting of the part is outputted to a display unit (not shown) connected to the personal computer 11, and the operation is ended. Finished so far is the explanation of the case where the present invention is embodied in the apparatus for inspecting the existence or non-existence of the part. Next, the explanation will be made on an apparatus for inspecting the part mounting state.

The measurement of the posture and the mounting accuracy of the part is important, the measurement being effected after executing batch soldering. The above-mentioned measurement is performed in anticipation of the case where the light-weight chip parts exhibit such behaviors as to stand erect, deviate and rotate particularly in the soldering/heating process, and the parts are fixed in a mounting state where the operation as normal electronic parts cannot be expected. As explained above, the part mounting state inspection apparatus inspects the posture and mounting accuracy of the part. A flow of inspection procedures will be stated as follows.

There exists herein no essential difference between the posture measurement and the mounting accuracy measurement, and hence mainly the posture measurement will be explained, while the description of the mounting accuracy measurement will be omitted.

To start with, a distance measurement known as a laser radar method will be described based on a principle diagram of FIG. 5. Given is an explanation of the fact that an upper portion of the board 6 can be scanned by the laser beam drawn with a broken line in the Figure by use of a galvano mirror 4.

The above-described scanning lens 5 is known as an $F\theta$ lens composed of an optical glass. The $F\theta$ lens is used for a scan type optical device such as a laser beam printer. $\theta$ is the angle at which the beam is incident on an exit pupil (corresponding to the galvano mirror 4 or 34 in the optical system) of the optical system, and F is the focal distance of the $F\theta$ lens. An image height (a distance from the optical axis in the scanning direction on the board) U of the image forming plane on the board is so designed as to be expressible such as:

$$U = F\theta$$

This is called as an $F\theta$ characteristic.

Many actual $F\theta$ lenses are composed of several lenses of reflex mirrors. If it is a so-called paraxial lens used only in the vicinity of the optical axis of the optical system, however, the $F\theta$ characteristic can be approximately actualized even by a single lens or concave mirror. The lens construction is determined depending on the measurement range.

When using the $F\theta$ lens, the galvano mirror defined as an exit pupil is rotated, and a positional variation $F\theta$ proportional to its rotational quantity $\theta$ can be caused. This kind of scanning method is used widely in the laser beam printer or the like.

The scan lens is employed in the laser beam printer for the purpose of scanning the laser beam on a photosensitive drum at an equal speed with an equal light quantity. A polygon mirror, an oscillation mirror and a hologram are employed by changing the $F\theta$ characteristic of the lens for each of a multiplicity of scanning methods. This embodiment, however, presents such an arrangement that the position indicated by the personal computer 11 is irradiated with the laser beam by use of the galvano mirror.

Figure 5:
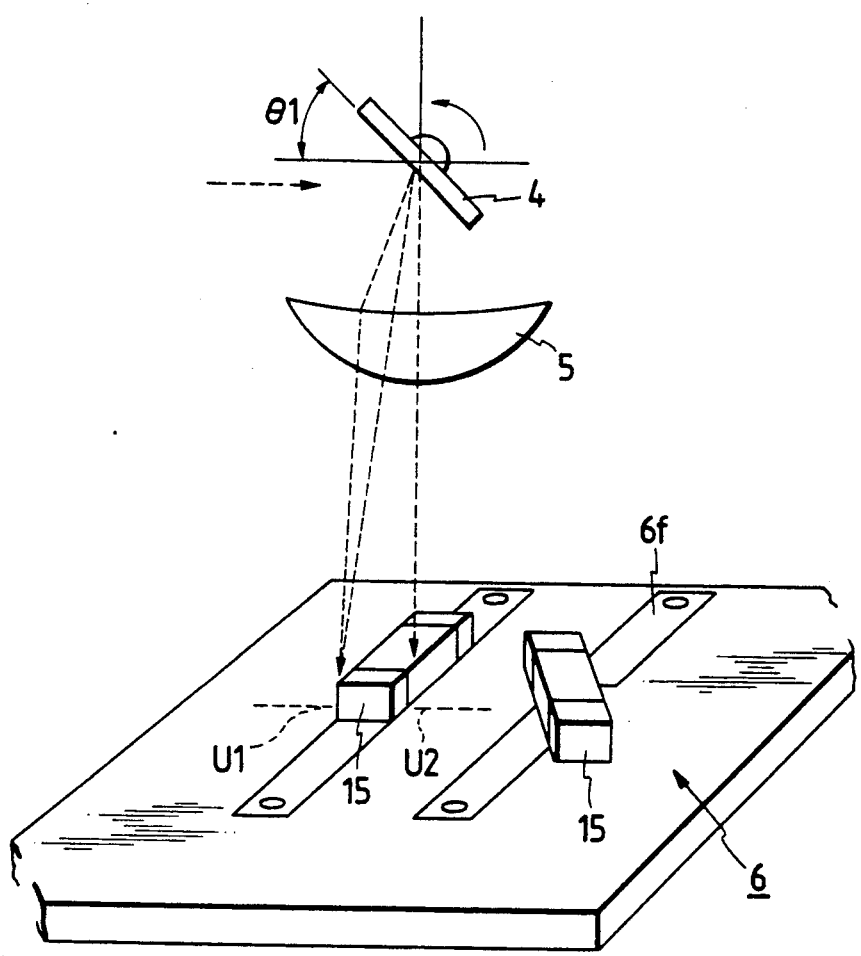
FIG. 5 is a block diagram illustrating the parts mounting inspection apparatus in a second embodiment.

Referring to FIG. 5, the scan is performed by using the laser beam shown with the broken line while measuring the distance from horizontal position U1 to U2. In this case, the personal computer 11 calculates a rotational angle $\theta 1$ of the galvano mirror which corresponds to the position U1 from a relation of $U = F\theta$.

The personal computer 11 gives a command to a motor controller (not shown) so that the galvano mirror 4 rotates through an angle $\theta 1$. In this manner, the U1 position becomes irradiated with the laser beam. Thereafter, if the personal computer 11 gives no command, the laser beam at U1 remains stationary forever.

After completing the measurement preparation, the personal computer 11 gives a command to the motor controller so that the motor is rotated at an equal velocity. If done so, the laser beam moves at an equal velocity while forming spots on the board. The rotating direction of the galvano mirror 4 is identical to the direction in which the laser beam moves towards the position U2.

The distance to the board 6 or the part 15 on the board which are defined as a measurement object is measured with a constant period while moving the measuring position at an equal velocity in this manner. The horizontal position on the measurement object can be obtained at equal intervals with a relation of height.

Just when the laser beams rotates to the position expressed such as $U2 = F\theta 2$, the personal computer 11 finishes the rotations of the galvano mirror 4. Thus, the execution of measurement of one sectional configuration is ended.

Next, when actualizing the measuring device capable of easily obtaining the height distribution on the board, a description will be given of how the posture of the part is judged.

FIG. 3 is a plan view when observing the substantially rectangular parallelopiped chip parts 15 mounted on the printed board 6. FIG. 3 is also a schematic diagram of height outputs, wherein the sectional configurations of the parts 15 are measured from the direction (vertical to the sheet surface) of the board upper surface by means of this measuring device. Referring to the same Figure, the symbol 15a, 15a designate electrodes provided at both ends of the chip part 15.

Figure 3A:
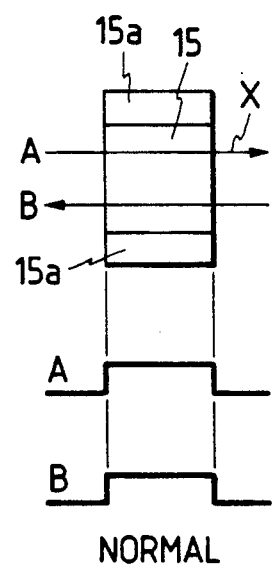
FIGS. 3A and 3B are a plan view showing a mounting state of the part assuming a rectangular parallelopiped and a height output diagram corresponding thereto.
Figure 3B:
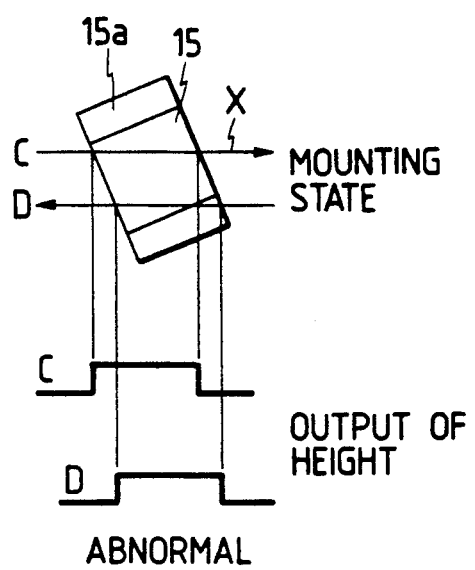

For facilitating the description herein, FIG. 3A illustrates a normal mounting state where the chip parts 15 are disposed in parallel along the four sides of the sheet surface. FIG. 3B illustrates an abnormal state where the chip parts are disposed obliquely to the sheet surface. In the respective states, it is assumed that the board 6 is disposed to move the respective distance measuring laser beams in the vertical direction of the sheet surface owing to a movement of the stage 13 in the horizontal direction of the sheet surface with rotations of the galvano mirror 4. Namely, for judging the abnormality detection in the mounting state of the part 15 from a height distribution measured by the above-explained distance configuration measuring device, the following method is accurate and simple. The posture of the part 15 is judged by knowing coordinates of edge positions of the part 15 from 2-spot measurements of the sectional configuration as indicated by line segments A, B illustrated in FIG. 3A.

The measuring procedures will hereinafter be described with reference to a flow chart of FIG. 4 in addition to FIG. 3. Positional coordinates, to be measured, of the part on the board are previously stored in a memory of the personal computer 11 on the premise of the measurement., The coordinates are irradiated with the laser beams in the vertical direction by driving the stage 13 to move the board 6 placed thereon and in the horizontal direction by rotating the galvano mirror 4. The irradiation is thus attainable. In the case of this arrangement, the personal computer 11 simply numerically controls each of the stage 13 and the driving motor for the galvano mirror 4. Arbitrary positions can be thereby irradiated with the laser beams, and it is possible to perform the height distribution measurement based on the sectional configuration measurement by the above-described method.

Now, the position of the stage 13 is at first vertically moved to measure the position of the line segment A on the basis of the coordinates of the part 15. For instance, if the coordinates of the central position of the parts 15 and vertical and horizontal dimensions of the part 15 are known, the initial position is set by locating upwards within a half of the vertical dimension of the part from the central position in the vertical direction and slightly outwards from the left end of the part in the horizontal direction.

Next, after finishing a predetermined setting process on the software, the line segment A is scanned by the laser beam while moving along it by rotating the galvano mirror 4. Heights in the position irradiated with the laser beams are sequentially continuously measured. Obtained are outputs A shown in FIG. 3A wherein the axis of abscissa represents indicative values to the galvano mirror 4, while the axis of ordinate represents relative heights to the board.

The coordinates of the rotational quantity of the galvano mirror 4 and the position of the laser beam in the horizontal direction of the sheet surface can be set to 1:1, and hence the axis of abscissa of the output A accurately indicates the position of the board 6 in step S11 of FIG. 4.

Thereafter, the position of the stage 13 is vertically moved up to a position enough to measure the line segment B (step S12 of FIG. 4). Outputs B in FIG. 3B are obtained by scanning in the same way as the way of obtaining the outputs A (step S13). In accordance with this embodiment, however, the data on the line segment A is obtained on the going path the galvano mirror 4 which reciprocates for a speed-up, and the line segment B is measured on the come-back path.

The edge positions of the part are shown by rises and falls of the outputs A, B of FIG. 3. Hence, the horizontal positions of the portion higher by a predetermined threshold value than the height of the board 6 (closer to the measuring device) can be judged as edge positions.

A supplementary explanation of a method of determining the threshold value will herein be given. Referring to FIG. 3, the higher portion of the trapezoid indicates the chip part, while the lower portion at the both ends indicate a height of the board. A difference between an offset value defined as a height of the board and the maximum value represents a height of the chip part. Further, a diameter of the laser beam is well smaller than a size of the chip part and typically 50 through 100 microns. The measurement result in the vicinity of the edges of the part is inclined depending on the diameter of the laser beam. Obtained generally by arithmetic is an intermediate value between the maximum height value and the height offset value of the board; and 50% positions thereof are defined as edges.

As illustrated in FIG. 3A, in the case of mounting the part in parallel with respect to the sheet surface according to the standard, the coordinates of the edge positions of the line segments A, B are coincident within the error range. As illustrated in FIG. 3B, however, in the case of mounting the part obliquely, the edge positions in measuring positions C, D cause a difference greater than the measurement error. (steps S14, S15)

If the difference between the edge positions exceeds the standard value set and inputted beforehand to the personal computer 11, the personal computer 11 outputs an abnormality of the mounting state and shifts to the next measurement (step S16). Besides, in order to modify the abnormal state after finishing the measurement, a robot hand (not shown) absorbs the part obliquely disposed as illustrated in FIG. 3B. The inclined quantity obtained by the above-described measurement is reversely rotated, and, with a normal posture, the part is remounted on the board. In this case, the data on this inclination detected quantity is employed.

Further, as explained earlier, in addition to the method of judging, as described above, the inclined angle from the difference between the edge positions, the inclination can be obtained absolutely in the same way even by comparing the intermediate position between the right and left edges and a weighted average position of the height distribution between the right and left edges. Merits and demerits of the above-explained method will depend on what kind of signal ratio S/N is obtained between the both ends of the measurement object part. Therefore, an adoption or rejection and selection are made according to colors and configurations of the parts. The inclination conceived as a typical part mounting mistake can be detected by the above-mentioned means.

Herein, in addition to the methods discussed above, if only the bilateral positional abnormalities of the part 15 with respect to the sheet surface may be detected irrespective of the posture abnormality in the rotating direction, it is unnecessary to make the sectional measurements twice as described above. The position of the part is obtainable from the edge positions at that moment simply by performing once the laser scan on the central position in the vertical direction.

Besides, after the soldering process, it is possible to detect that the chip part is raised with one electrode 15a serving as a fulcrum and also a deterioration of floating with respect to the board 6 by a comparison with a difference in the height distribution between the normal case and this situation.

As discussed above, because of using the galvano mirror 4, it is feasible to effect a random scan or a raster scan by using the laser beams. The scanning methods are also selectable depending on the part configuration and measurement items. An emitting/receiving path of the laser beams is used in common, whereby the device can be easily miniaturized and integrally constructed. Besides, because of using the personal computer 11, it is also possible to readily correct the measurement result by previously measuring an aberration of an optical system such as a lens and a non-linearity of an electric system such as an amplifier.

Further, the personal computer 11 may incorporate a variety of judging functions and display functions. Hence, visualization is also attainable by indicating, to the operator and other automatic devices, an alarm and a supplement when the part is damaged and also a correction of a part deviation quantity and by displaying a placement of the parts.

Then, the oscillation frequency can be indicated to the oscillator 1 directly from the personal computer 11, therefore, it is feasible to select a frequency suited to the measurement accuracy.

For instance, if the phase difference is detectable up to 0.1 degree, and when the modulation frequency is 1 gigahertz, a difference as small as 50 $\mu$m is detectable. However, if a step difference of 1 cm or greater is measured, the phase difference becomes large. The required accuracy of the circuit increases. In this case, however, the phase speed may be reduced by decreasing the frequency down to 100 megahertz. Further, it is executable to obtain a variation in the part height by use of the formula (6) in the method of obtaining such a frequency that the output of the phasemeter 10 becomes a constant value.

Moreover, the majority of the phasemeters 10 are, even though they are ordinary products, capable of measuring not only a phase difference of the input signals but also intensities thereof and therefore capable of measuring a reflected light quantity of the laser beam. It is possible to simply obtain a distance up to the part and a reflectivity of the upper surface of the part as well. It is feasible to judge the existence or non-existence of the part and a material of the measuring spot more accurately in combination with judgments of not only the height but also the reflectivity.

Besides, the galvano mirror is employed in one scanning direction, hence an optical system equivalent to the laser beam printer for civil use is usable. Inexpensive optical lenses are, therefore, usable.

In addition to the embodiment discussed above, a polygon mirror may be used in place of the galvano mirror for laser beam scanning. In this case, the price can be reduced, and the raster scanning speed can be improved. Further, the distance is picturized by the personal computer 11, and the positional accuracy of the part can be also measured by a commercialy available image processor.

On the other hand, there can be employed a modulation based on AO·EO element which is defined as a method other than the direct modulation method of the semiconductor laser described in the embodiment as a laser modulation method and a modulation utilizing beats by a 2-frequency laser. In this case, the modulation assuming a configuration more approximate to a sine function is obtained, so that the measurement accuracy is more improved.

Furthermore, the lens 7 and the high-speed photo diode 8 can be disposed in such positions outside the optical system that scattered light from the printed circuit board 6. In this case, the dead angle increases more or less. However, a split ratio of the beam splitter 3 is freely settable, thereby improving the using efficiency of the laser beams. Additionally, two or more photo diodes may be provided.

Figure 6:
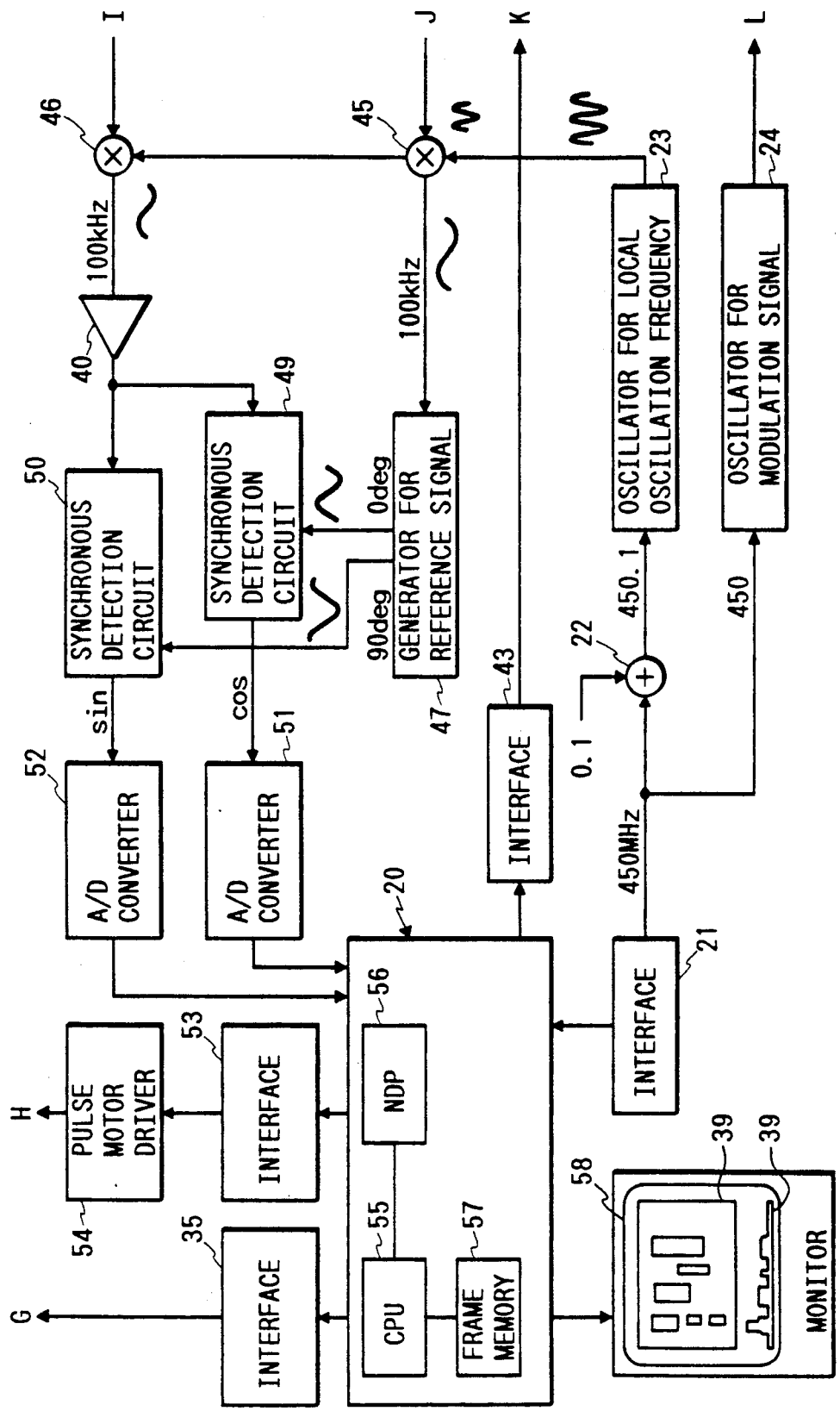
FIGS. 6 and 7 are block diagrams illustrating the parts mounting inspection apparatus in a second embodiment.
Figure 7:
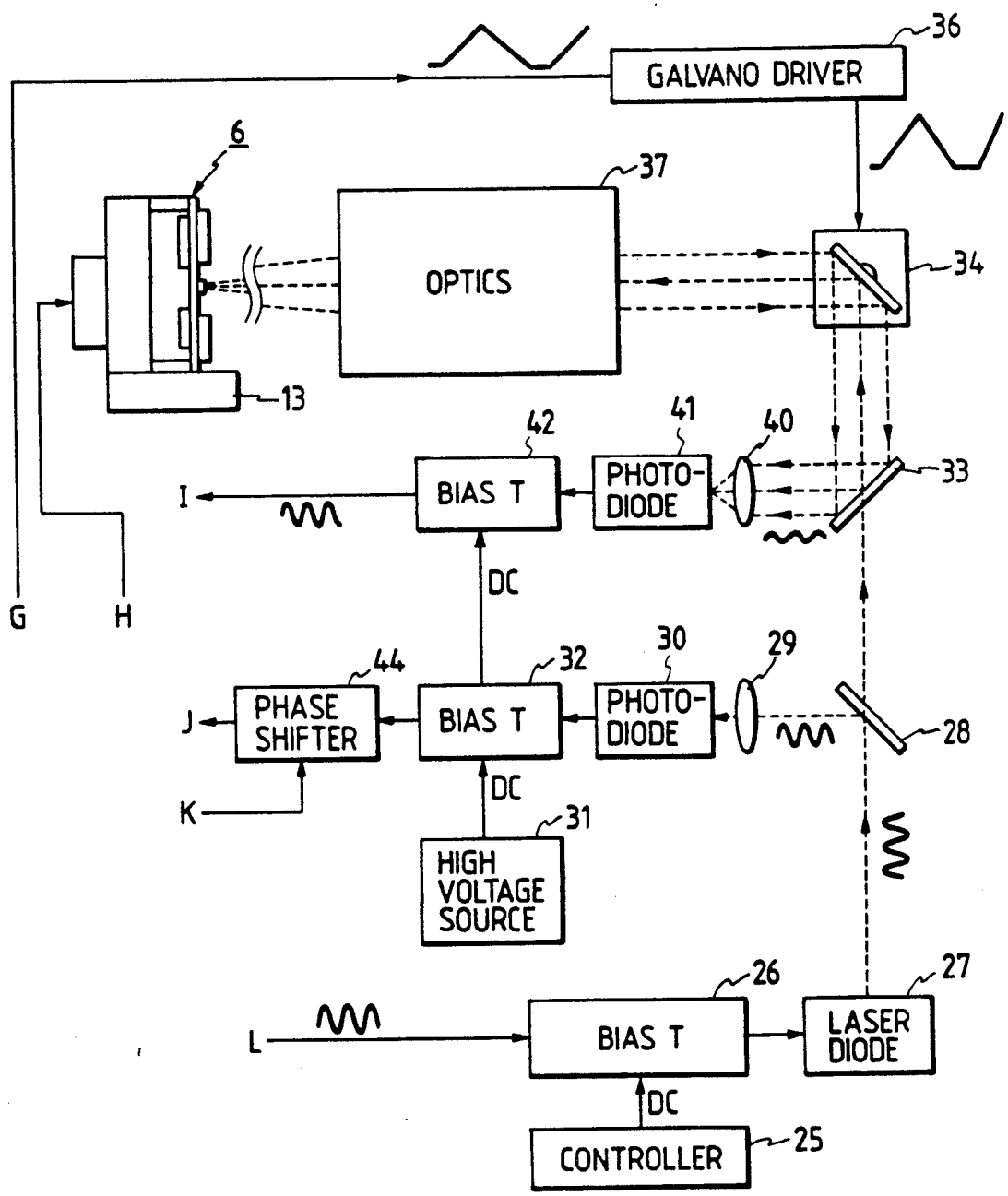

Next, FIGS. 6 and 7 are block diagrams showing a second embodiment.

Referring to FIGS. 6 and 7, the numeral 20 denotes a computer for arithmetically controlling the present measuring device as a whole; 21 an interface for controlling the oscillator; 22 an adder for adding digital numeric values; 23 a local oscillation frequency oscillator; 24 a modulation signal oscillator; 25 a 10 controller for controlling an average output of the laser diode; 26 a bias overlapping circuit ( hereinafter referred to as "bias T" conceived as a high frequency term) for mixing a DC current and a high frequency current; 27 a laser diode for emitting the laser beam; 28 a beam split mirror for separating the laser beam; 29 a lens for condensing the laser beam; 30 a photo diode for generating a reference signal voltage by photoelectrically converting the laser beam; 31 a high voltage power supply for applying a voltage to the photo diode; 32 a bias T for separating the high frequency current and the DC current in the signals; 33 a holed mirror having its central portion through which the laser beam passes; 34 a galvano mirror for unidirectional laser beam scanning; 35 an interface for outputting a control signal to the galvano mirror; 36 a galvano controller for supplying a driving voltage to the galvano mirror; 37 an optical system, exhibiting an F$\theta$ characteristic, for forming a laser spot in a position proportional to a scanning angle of the laser beam; 38 a stage for holding and scanning the board to be checked; 39 a board to be checked; 40 a lens for condensing the reflected beams; 41 a photo diode for photoelectrically converting the reflected beam into a measurement signal voltage; 42 a bias T for separating the high frequency current and the DC current in the signals; 43 an interface for controlling a phase shift quantity; 44 a phase shifter for shifting a phase of the high frequency; 45, 46 heterodyne multipliers for multiplying a reference signal by an output of the photo diode and outputting a difference frequency; 47 a reference signal generator for generating 2 signals of a signal assuming the same phase with the input signal and a signal which is out of phase 90 degrees; 48 an amplifier for amplifying an infinitesimal voltage; 49, 50 synchronous detection circuits for detecting the phases; 51, 52 A/D converters for measuring the voltage and digitizing it; 53 a pulse motor controller interface for driving the stage; 55 a central processing unit (CPU) incorporated into the computer; 56 a numerical data processor (NDP) within the computer; 57 an image memory within the computer; and 58 a monitor for display-outputting the measurement results.

Based on the construction given above, the computer 20 indicates a digital frequency value to the oscillator 24 through the interface 21 in order to modulate the laser diode 27 at one frequency suited to the measurement, the frequency (e.g., 450 MHz) between 400 MHz and 500 MHz in this embodiment. An output of the oscillator 24 oscillating with a sine wave of 45 MHz is mixed with a DC output of the laser diode controller 25 in the bias T26. A high frequency current is applied to the laser diode 27.

The laser diode 27 emits the light with a light quantity substantially proportional to the applied current, and the output thereof is modulated with the sine wave. The laser beam emitted from the laser diode 27 is partly split by the beam split mirror 28 and led via the lens 29 to the photo diode 30. Voltages are impressed on the photo diode 30 and a photo diode 41 which will be mentioned later by means of the high voltage power supply 31, whereby the modulation light as high as 500 MHz can be optically converted without any problem.

The bias T 32 fetches only a high frequency component of a signal of the photo diode 30 which has undergone the photo conversion; and this signal serves as a reference signal for the phase measurement. Besides, the beam penetrating the beam split mirror 28 passes through the central hole of the holed mirror 33 and is incident on the scanning galvano mirror 34.

Herein, the operations of the galvano mirror 34 and the stage 38 will be explained. The computer 20 indicates a rotational quantity to the galvano motor controller 36 via the interface 35, thereby rotating the galvano mirror 34. An incident angle of the laser beam upon the optical system 37 is thereby scanned.

Herein, the optical system 37 exhibits the F$\theta$ characteristic, and hence a beam spot is formed in the position on the board which is proportional to the rotational angle of the galvano mirror 34. Particularly in this embodiment, as illustrated in the Figure (optical drawing), the laser beam is incident on the board 39 to be checked as vertically as possible. The dead angle associated with the part is thus eliminated.

The board 39 is moved in a direction orthogonal to the scanning direction of the galvano mirror 34 by driving the stage 38 after the computer 20 has given an instruction to the pulse motor driver 54 via the pulse motor controller interface 53. This operation is indispensable for actualizing the part checking algorithm explained in the first embodiment discussed above.

Among the beams scattered by the parts and the surface of the board 39 located by the stage 38, a component scattered in the direction of the lens 37 is again collimated through the lens 37 and travels along the path in the direction opposite to the going direction, the light component is then reflected by the galvano mirror 34, further reflected by the holed mirror 33 and led to the photo diode 41 via the condenser lens 40.

This measurement beam incident on the photo diode 41 has a phase difference proportional to a flight time difference as compared with the reference beam incident on the photo diode 30 and therefore preserves the information on the variation in the optical distance up to the board in the form of the phase difference. A DC component of the signal photoelectrically converted by the photo diode 41 is eliminated by the bias T 42, with the result that only the high frequency is left. This becomes a measurement signal for measuring the phase.

Measured herein is a phase difference between the reference signal conceived as an output of the photo diode 30 and the measurement signal as an output of the photo diode 41. As in the explanation of the principle, through the distance variation can be obtained, it is difficult in many cases in terms of costs to measure a phase of the signal of about 500 MHz directly with a resolving power of 1 degree or under on the basis of the present electric circuit technology. This is attributed to the fact that the phase difference of 1 degree of the wave having 500 MHz cannot be measured if there is no circuit technology having a time accuracy as small as 1 p (pico) second. To cope with this, in accordance with this embodiment, the phase is measured by reducing the frequency by approximately three digits on the basis of a heterodyne circuit method usually employed in the radio circuits.

Herein, a heterodyne detection circuit in this embodiment will be described. The description will start with the heterodyne principle. As known well, in the consideration of multiplying signals having two angular frequencies 1 and 2, the output P is given as follows:

$$\begin{aligned} P &= \sin(\omega 1 t + \phi 1) \times \sin(\omega 2 t + \phi 2) \\ &= 1/2(\cos((\omega 1 - \omega 2)t + (\phi 1 - \phi 2)) + \\ &\quad \cos((\omega 1 + \omega 2)t + (\phi 1 + \phi 2))) \end{aligned}$$

(where t is the time, and $\phi 1$, $\phi 2$ are respectively phases).

The second term is herein a remarkably high frequency, therefore, is easily separable. Only the first term is, as a matter of fact, multiplication-outputted.

Hence, there is obtained the signal which oscillates at the angular frequency $\omega 1 - \omega 2$ with the phase $\phi 1 - \phi 2$. If $\phi 2$ is selected as an original point of the phase, a variation of $\phi 1$ is detectable. In this case, the signal having $\omega 1$ is often referred to as a radio frequency input (RF), while the signal having $\omega 2$ is referred to as a local oscillation frequency input (LF).

The execution of this operation involves the use of a heterodyne multiplication circuit and a local oscillation signal source. This operation will be explained in the embodiment. As described above, the local oscillation frequency must have a very small frequency difference with respect to the signal to be measured. Therefore, the local oscillator 23 must have a fixed difference of approximately 100 KHz with respect to the modulation signal oscillator 24.

Then, an indicative value corresponding to 100 KHz is added to the digital indicative value of the oscillator controlling interface 21 by means of the digital adder 22. The indicative value is inputted to the local oscillation frequency oscillator 23. With this arrangement, a signal having the same frequency difference can be always obtained without depending on the indication oscillation frequency.

The thus caused local oscillations are inputted to the multipliers 45, 46. The reference signal and the measurement singals are changed into the signals having absolutely the same frequency of 100 KHz owing to the heterodyne effect, and the frequencies of the two signals are preserved.

At this moment, the measurement signal still has a voltage as infinitesimal as about $\mu V$ in the great majority of cases and is therefore amplified by the amplifier.

In this manner, if possible of amplification after changing it to a low frequency, the measurement can be performed with a good phase characteristic even by an amplifier which is not suited to the high frequency amplification.

Herein, a low frequency phase measuring method will be explained. The low frequency phase detection does not involve the use of the heterodyne method. It is because a frequency band is narrow, and hence a sufficient S/N can be obtained even in the same frequency detection.

This is referred to as a synchronous detection, and the principle thereof will be explained.

The synchronous detection may be considered in a special case where the heterodyne detection is executed by setting the frequency difference to 0. In the consideration of multiplying two signals having the same angular frequency, the output P is given by:

$$\begin{aligned} P &= A\sin(\omega t + \phi 1) \times B\sin(\omega t + \phi 2) \\ &= 1/2 AB(\cos((\omega - \omega)t + (\phi 1 - \phi 2)) + \\ &\quad \cos(2\omega t + (\phi 1 + \phi 2))) \end{aligned}$$

(where t is the time, and $\phi 1$, $\phi 2$ are respectively phases, and A, B are amplitudes thereof) Herein, the second term is remarkably high frequency and is therefore easily decomposable. Hence, only the first term is, as a matter of fact, multiplication-outputted.

$$[\tfrac{1}{2}AB\cos(\phi 1 - \phi 2)]$$

Obtained therefore is a DC signal having no oscillation component at the angular frequency 0 with the phase $\phi 1 - \phi 2$. If $\phi 2$ is selected as an original point, a variation of $\phi 1$ is detectable.

The synchronous detection circuits 49, 50 perform the above-mentioned multiplications. Herein, the reason why the two synchronous detection circuits 49, 50 are needed will be elucidated. If signal amplitudes A, B are known and fixed, there is no particular problem when analyzing the phase difference $\phi 1 - \phi 2$.

The amplitude AB proportional to the reflected light quantity, however, largely changes depending on the reflectivity of the parts. Then, two measurement signals are required for obtaining AB and $\phi 1 - \phi 2$. It is proper that the synchronous detection signals which are output phase 90 degrees are employed as these two signals.

Namely, when multiplying a reference signal $B\cos(\omega t + \phi 2)$ which is output phase 90 degrees with respect to P described above, the following formula is established:

$$\begin{aligned} Q &= A\sin(\omega t + \phi 1) \times B\cos(\omega t + \phi 2) \\ &= 1/2 AB(\sin((\omega - \omega)t + (\phi 1 - \phi 2)) + \\ &\quad \sin(2\omega t + (\phi 1 + \phi 2))) \end{aligned}$$

Herein, the second term is a remarkably high frequency and is therefore easily separable. Only the first term is, as a matter of fact, multiplication-outputted.

$$= \tfrac{1}{2}AB(\sin(\phi 1 - \phi 2))$$

Thus, $$P = \tfrac{1}{2}AB(\cos(\phi 1 - \phi 2))$$

$$Q = \tfrac{1}{2}AB(\sin(\phi 1 - \phi 2))$$

The two signals expressed above are obtained, and the calculations are effected to readily obtain the phase difference $(\phi 1 - \phi 2)$. For example, in this embodiment, the phase difference is obtained as follows:

$$\begin{aligned} R &= Q/P \\ &= \frac{1/2 AB(\sin(\phi 1 - \phi 2))}{1/2 AB(\cos(\phi 1 - \phi 2))} \\ &= \tan(\phi 1 - \phi 2) \\ \therefore \phi 1 - \phi 2 &= \tan^{-1} R \end{aligned}$$

The phase difference between the two signals can be measured simply by obtaining an arc tangent of a ratio of the two signals in this way, i.e., the distance variation can be measured in according to the present measurement. Further, $$\begin{aligned} S &= \sqrt{P^2 + Q^2} \\ &= \sqrt{(1/2 AB(\cos(\phi 1 - \phi 2)))^2 + (1/2 AB(\sin(\phi 1 - \phi 2)))^2} \\ &= 1/2 AB \end{aligned}$$

Therefore, the signal proportional to the input is also obtainable.

This value is usable for an estimation of the reflectivity. The explanation of the synchronous detection is ended so far.

A method of actualizing the phase measurement based on the above-mentioned synchronous detection will be explained in accordance with this embodiment. To begin with, two signals having 0 degree and 90 degrees are generated by the reference signal generator 47 in combination with the reference signal. An oft-used circuit is arranged such that a phase delay quantity of a capacitor is adjusted.

With these two signals serving as reference signals, the output of the amplifier 48 is branched off in two ways and inputted to the two synchronous detection circuits 49, 50. The synchronous detection circuits 49, 50 output multiplied results COS and SIN components associated with the two reference signals. These components are converted into digital numeric values by the A/D converters 51, 52 and taken into the computer 20. Generally, since the arc tangent calculation gives a large load on the central arithmetic circuit 55, the speeded-up arc tangent arithmetic is effected by the numerical data processor 56.

The thus obtained phase is used for the part checking algorithm described in the foregoing embodiment and also utilized for visual understanding of the measure while being stored in the image memory.

A role of the phase shifter 44 will herein be supplemented.

Generally, the phase measurement of the electric circuit is performed through all the angles of 0–360 degrees in many cases. As in the present measuring device, however, when effecting the measurement through 0–360 degrees, the distance dynamic range D is given by:

$$D = c/2f = 0.33 \text{ m}$$

where the frequency f=450 MHz, and the light speed c=$3\times10^8$. If remarkably longer than the height of the electric part, there is absolutely no obstacle when the phase measuring range is limited to about ±15°.

In this case, the intensities of the signals outputted by the two synchronous detection circuits 49, 50 can be substantially equalized. More specifically, if the phases, 0 degree and 90 degrees, of the two reference signals show differences of −45 degrees and +45 degrees with respect to the phase of the measurement signal, the sine and the cosine are mathematically equal in the case of the phase difference of 45 degrees, and it is therefore possible to equalize the outputs of the two synchronous detection circuits.

For this reason, a phase shift quantity of the phase shifter 44 is previously adjusted by the interface 43. The phase difference, 0 degrees, of the reference signal may be coarsely controlled in the vicinity of the position of −45 degrees with respect to the measurement signal.

This adjustment does not require accuracy. If adjusted at arbitrary one point on the board 39, there is no possibility in which the phase difference causes a deviation of 10 degrees or more because of the part height being small.

With this arrangement, the outputs of the synchronous detection circuits 49, 50 become voltages of the same digits. A variety of voltage errors within the synchronous detection circuits and quantization errors of the A/D converters 51, 52 can be deemed to the same degrees. Hence, the necessity for fine adjustments of the hardware and bearing of the elements can be eliminated. It is, therefore, feasible to reduce the costs for the adjustments and the parts of the whole device. Further, the quantities of the currents flowing in the circuits can be deemed to the same degrees. Phase drifts due to an increase in the temperature are deemed to the same degrees. Hence, the measurement drifts are ignorable in terms of measuring the phase difference, and there is exhibited an effect of improving the accuracy.

Figure 8:
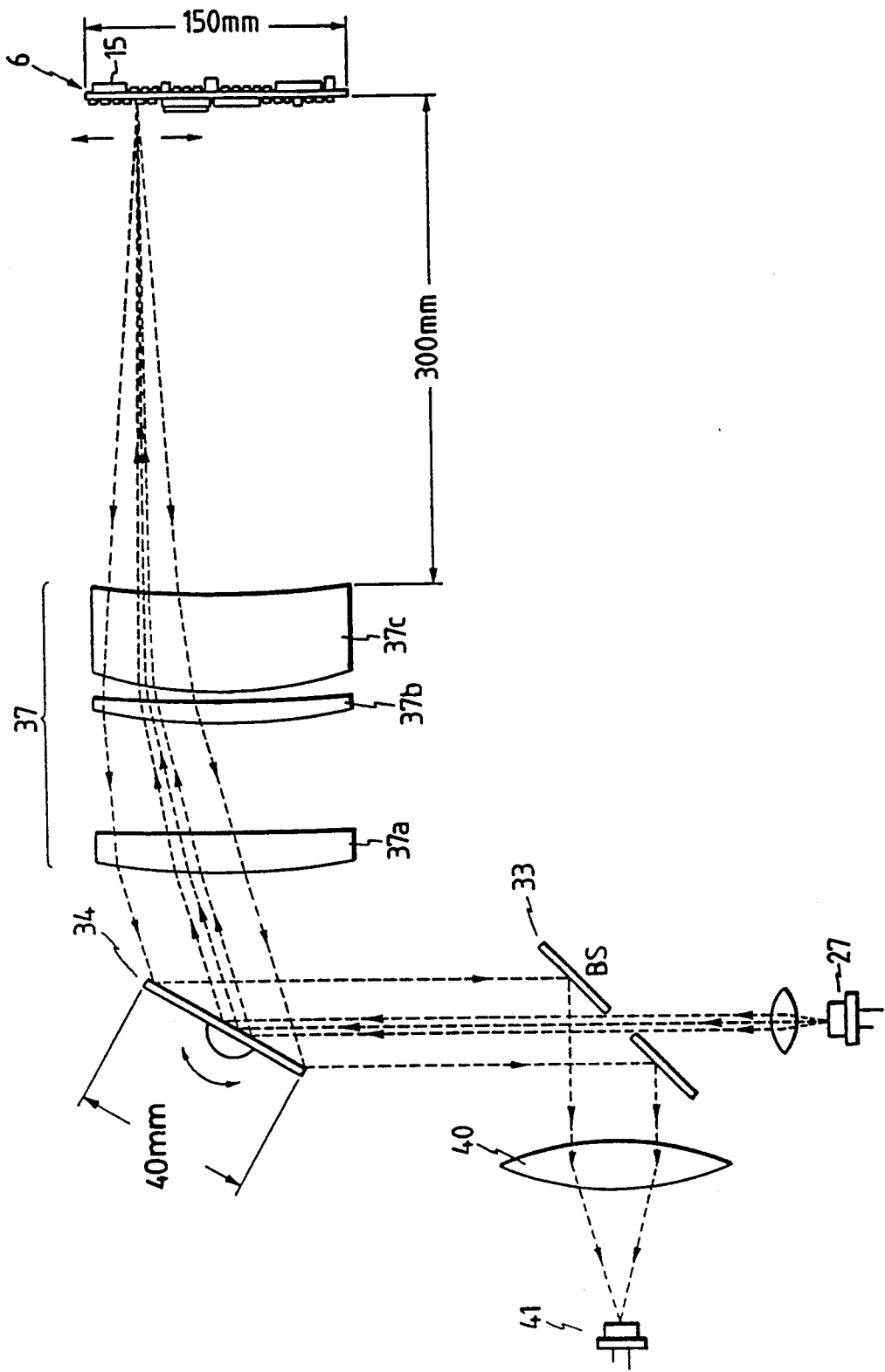
FIG. 8 is a plan view depicting a laser optical system.

Next, FIG. 8 is a diagram illustrating an actual placement of the laser optical system of FIGS. 6 and 7. The constructive elements which have already been explained are marked with the same symbols, and the description will be omitted. A height of the board 6 is approximately 150 millimeters. The parts 15 are mounted on both surfaces. An output surface of a first lens 37c of the optical system 37 is positioned about 300 millimeters away from the surface of the board 6. On the other hand, a second lens 37b is disposed adjacently thereto. A third lens 37a is disposed a little bit away from the second lens 37b.

Provided next to the third lens 37a is a galvano mirror 34, a reflection surface of which has a wide dimension of 40 millimeters, in such a manner that the galvano mirror is rotationally driven in arrowed directions. The laser beams outputted from the laser diode 27 through the hole of the downward holed mirror 33 are incident on the third mirror 37a. Simultaneously, the reflected beams with which the board and the part are irradiated are reflected by the holed mirror 33 and further reflected by the condenser lens 40. The laser beams can be thus inputted to the photo diode 41.

Since the optical system is thus constructed, the laser beams shown by broken lines in the Figure are substantially orthogonal to the board 6, whereby the laser beams sufficiently impinge on even the lower parts disposed in close proximity to the relatively higher parts. Namely, an influence of the edges of the higher parts is not exerted on the lower parts.

Next, where the part 15 is a cylindrical part, the accuracy of the mounting position can be obtained by measuring the 2-spot sectional configuration as in the same way with the angular chip part. This is, however, mentioned in the inspecting principle diagrams of FIGS. 9A and 9B. Referring to the same Figures, FIG. 9A illustrates a normal mounting position when observing the cylindrical part from the upper surface of the board, while FIG. 9B shows an abnormal case.

Figure 9:
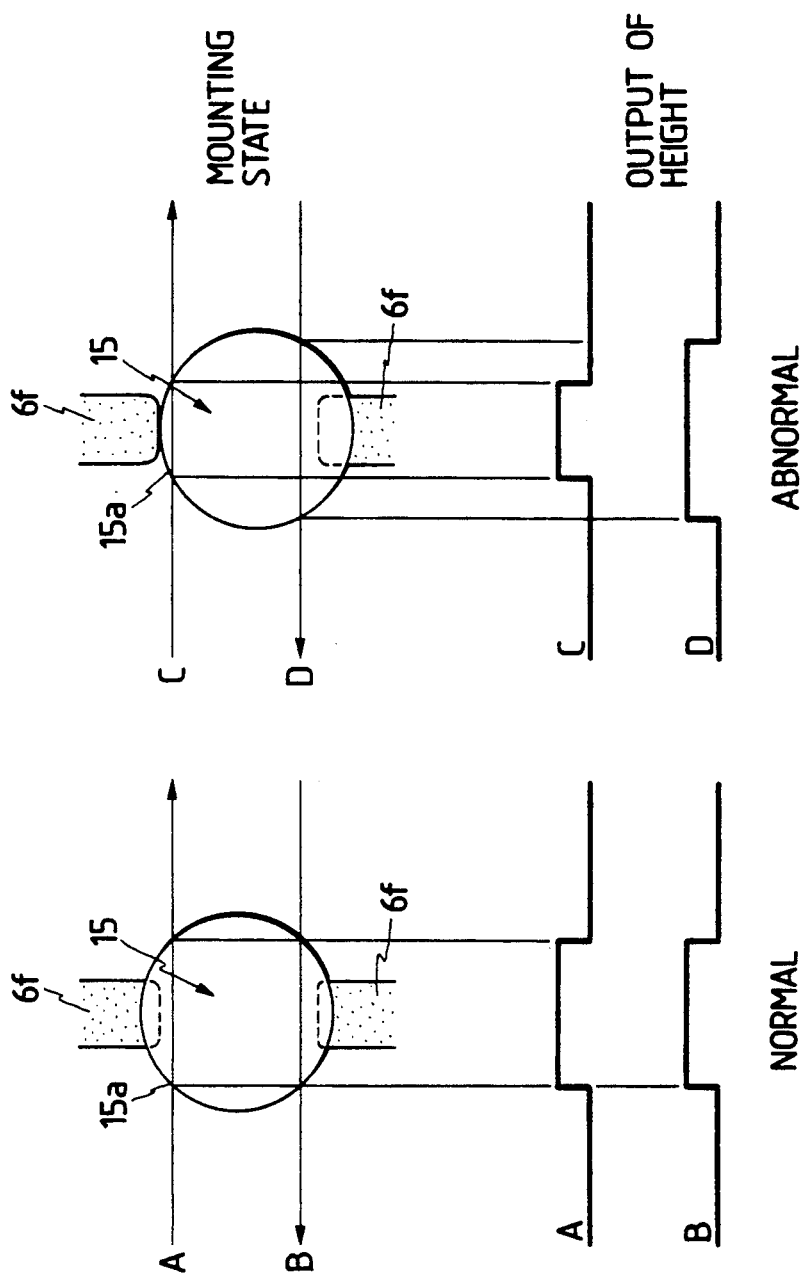
FIGS. 9A and 9B are a plan view showing the mounting state of a round part and a height output diagram corresponding thereto.

The two spots to be measured are, as illustrated in FIG. 9A, positioned apart such distances from the cylindrical center as to exhibit a symmetry 10 between the upper and lower halves. In such positions, sectional widths of the cylinder are to be equal.

However, if disposed with a downward deviation in the vertical direction (FIG. 9B), a large difference is caused in the widths at the two spots even when measuring the width in the same position on the board 6. This difference between the up and down widths is comparatively calibrated with a limit sample, thereby inspecting the part mounting position.

Concretely, as in the same way with the above-mentioned angular chip part, the position of the stage 13 is at first vertically moved beforehand enough to measure the position of the line segment A on the basis of the coordinates of the part 15. Positioning is effected in the upper half of the part vertical dimension from the central position and slightly outwards from the part left end in the horizontal direction. This is set as an initial position.

After setting various items in terms of software, the galvano mirror 4 is rotated, whereby the line segment A is scanned by the laser beam while moving along it. The heights in the positions irradiated with the laser beams are sequentially measured. Obtained are outputs marked with A in the schematic diagram wherein the axis of abscissa indicates an indicative value to the galvano mirror 4, while the axis of ordinate indicates a relative height to the board. A ratio of the rotational quantity of the galvano mirror 4 to the coordinates of the position of the laser beam in the horizontal direction of the sheet surface is fixed to 1:1. Therefore, the axis of abscissa of A in the schematic diagram accurately shows the position of the board 6. Thereafter, the position of the stage 13 is vertically moved up to such a position that the line segment B can be measured. Outputs marked with B in the schematic diagram is obtained by absolutely the same operation. In accordance with this embodiment, however, the data of the line segment A is obtained on the going path of the galvano mirror 4 which reciprocates for a speed-up, while the line segment B is measured on the come-back path.

As illustrated in FIG. 9A, if mounted in the position according to the standard, coordinate intervals of the edge positions of the line segments A, B are coincident within the error range.

As depicted in FIG. 9B, however, when considering the parts so mounted as to deviate up and down, a difference larger than the measurement error of the present device is caused in the intervals of the edge positions between the measurement positions C, D.

If this edge width exceeds the standard value previously set and inputted to the personal computer 11, the personal computer 11 outputs an abnormality in the mounting state and shifts to the next measurement.

Further, for modifying the abnormality after finishing the measurement, a robot hand (not shown) absorbs the part which is, as shown in FIG. 9B, disposed with the deviation and moves it by the deviated quantity obtained by the above-described measurement. This data is usable for the operation to remount the part on the board in the normal position. Besides, if the part deviates not vertically but horizontally, the absolute value itself of the edge position takes an abnormal numeric value, and the positional abnormality can be judged.

Figure 10:
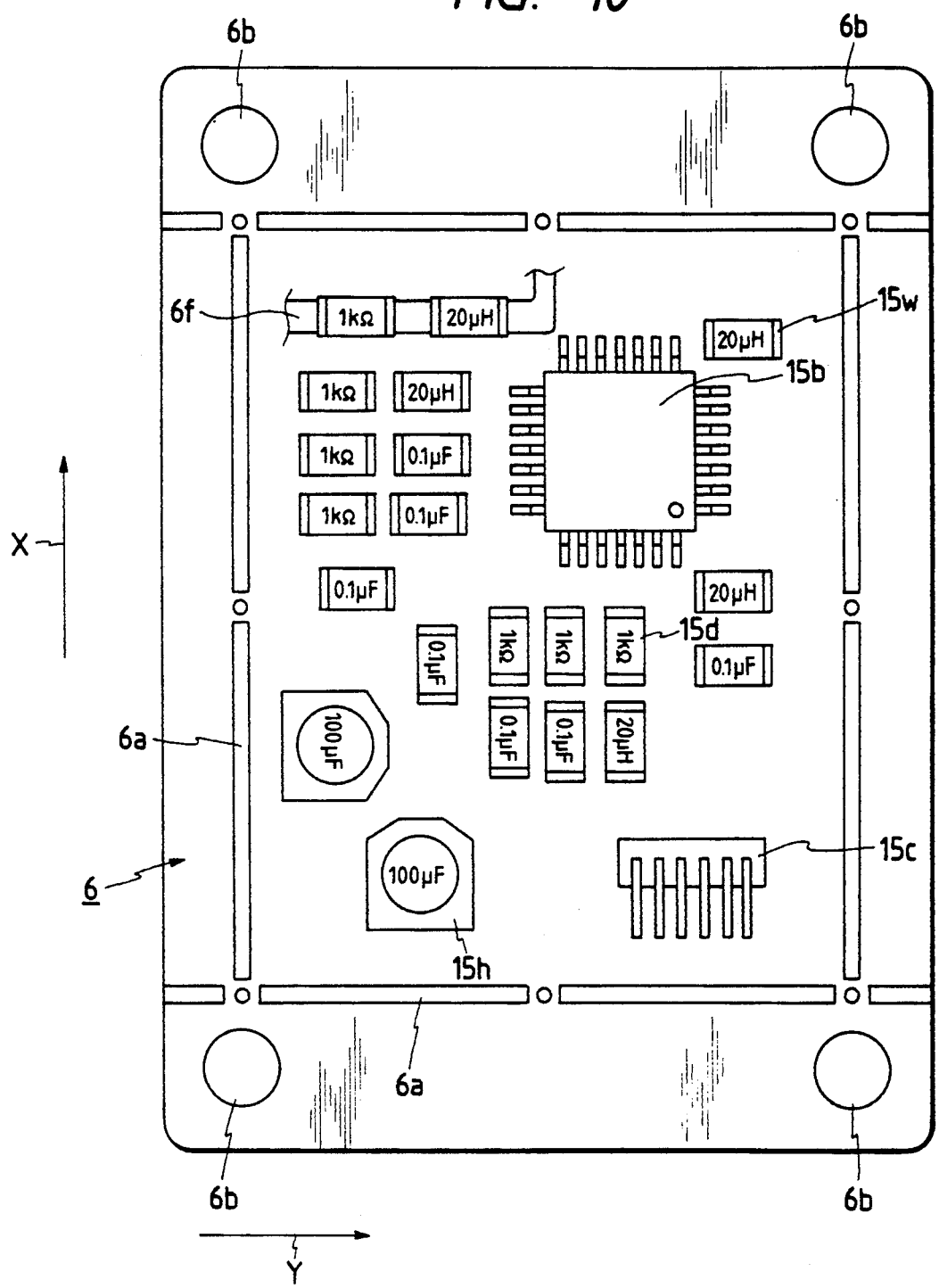
FIGS. 10 and 11 are plan views each showing a complete board.

Finally, an example of the board obtained through the above-described automatic check steps will be described with reference to the drawings. FIG. 10 is a plan view illustrating a mounted board. In the same Figure, a predetermined resin plate material is worked in a predetermined external configuration by press working. On the other hand, the board 6 is formed with a holes 6b for fixing onto the stage 13 at four corners with the accuracy determined. Coordinate positions X, Y of each mounting part 15 are, if fixed onto the stage 13, automatically determined. Then, after mounting, a complete product is obtained by effecting a cutting process with four dividing groove slits 6a serving as cutting faces. A mounting pattern 6f is formed on the above-described board 6. Mounted thereon are a large LSI of a part 15b, a chip part resistor 15d, a capacitor 15h, a coil part 15w, a connector part 15c and others. The complete product is thus acquired through the above-mentioned automatic inspecting steps.

Figure 11:
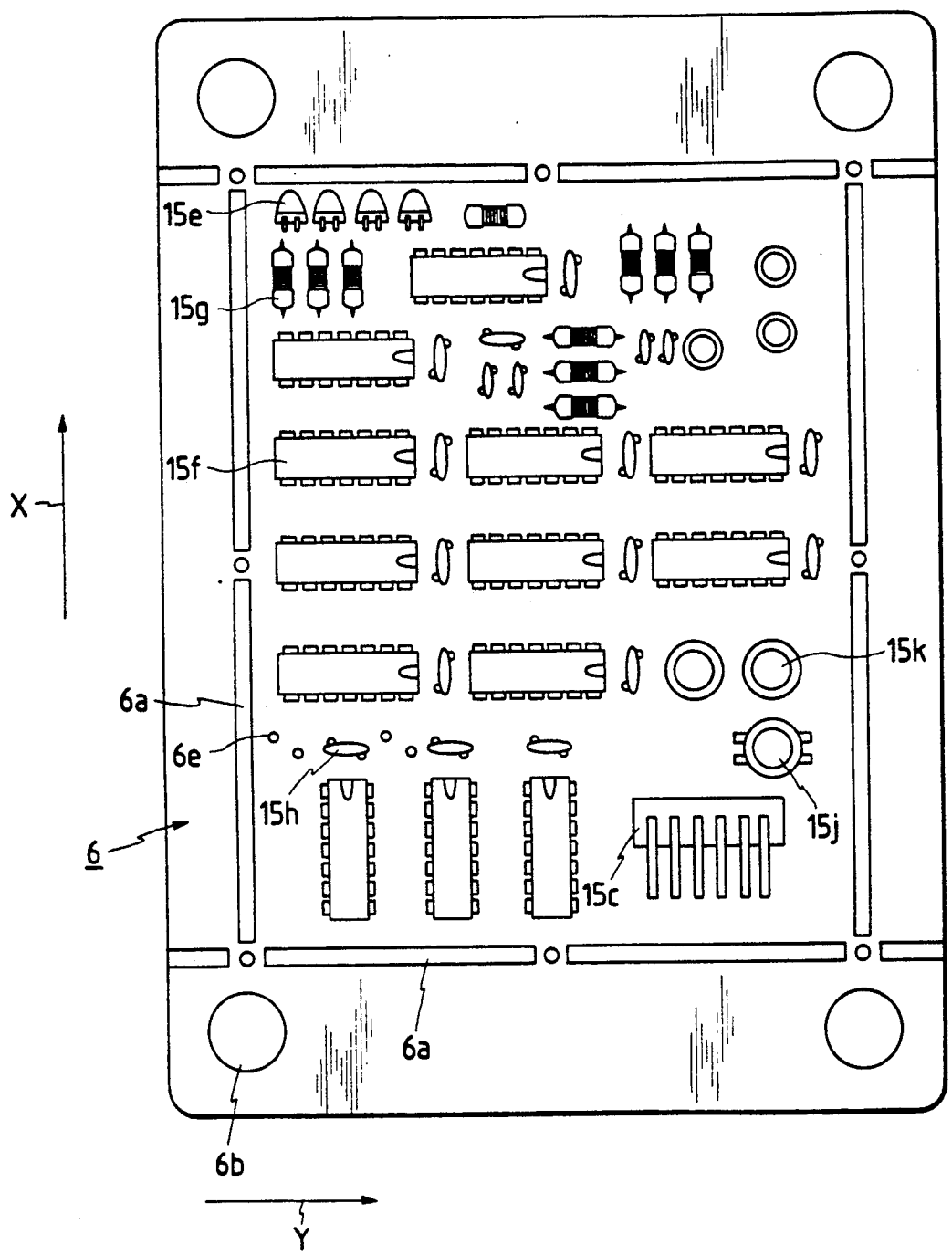
Figure 12:
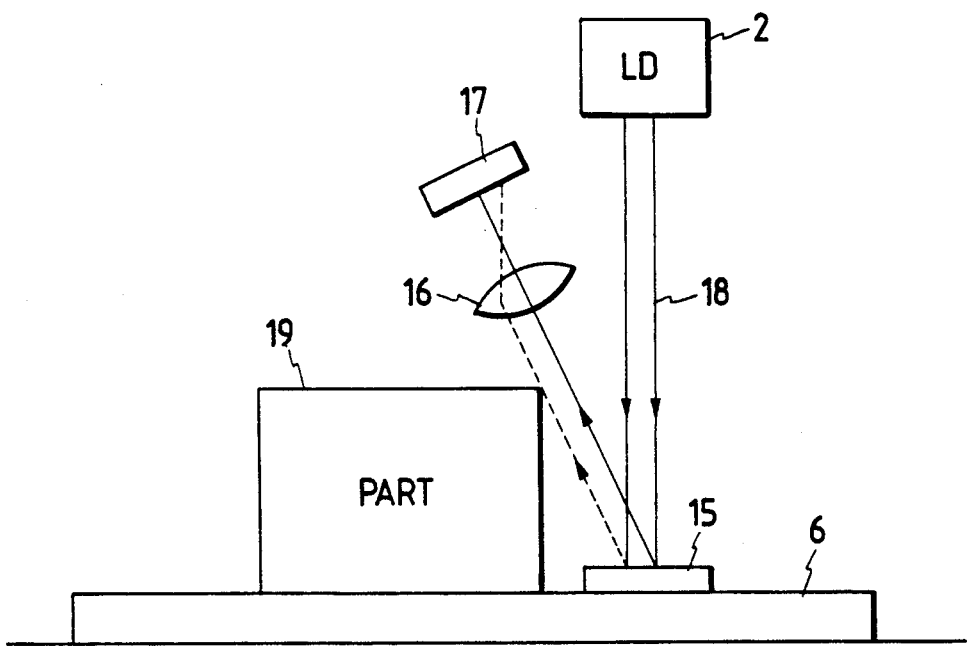
FIG. 12 is a diagram of assistance in explaining the principle of a conventional trigonometrical measuring method.

Further, FIG. 11 is a plan view illustrating the mounted board 6. A multiplicity of through-holes 6e are formed in place of surface mounting. Illustrated therein is a situation of obtaining the complete product after inserting a lead wire. In the same Figure, the symbol 15f designates an IC part including a lead frame; 15g a resistor having the lead wire; 15e a light emitting diode; 15k a coil part; and 15h a capacitor. The board 6 is constructed in the same way as the above-mentioned. Herein, there is no inconvenience at all if surface mounting type chip parts and through-hole mounting type electronic parts are, though not shown, mounted on the common board.

Note that the present invention may be applied to a system consisting of a plurality of appliances and to a device composed of a single appliance. Further, the present invention is, as a matter of course, applicable to a case where the invention is accomplished by supplying a program to the system or the device.

It is to be noted that the description about the inspection device has dealt with the circuit board mounted with the electronic parts. However, the inspecting device exhibits a high value of utilization in fields other than this and effectively applicable to inspection of the existence or non-existence, posture and mounting accuracy of the parts in general industrial products.

Moreover, the distance measurement result does not depend on the spot pattern of the laser beams on the measurement object. Hence, even when flaws and a print film exists on the measurement surface, the measurement can be done. Besides, the incident direction perpendicular to the measurement object can be set, and the measurement accuracy does not depend on the distance. Therefore, the measurement object may be placed in a remote place. For this reason, the lens having a large aperture is usable, and the beam scanning range can be also widened.

As discussed above, the present invention provides the-parts mounting inspection method capable of setting to a small value the distance between the parts and the device without undergoing constraints in terms of the parts mounting intervals and heights and also causing errors in the measurement values even when a density difference exists on the reflection surface.

Further, the present invention provides the parts mounting inspection device usable in the case of setting to a small value the distance between the parts and the device without undergoing the constraints in terms of the mounting intervals of the parts and heights and also causing errors in the measurement values even when a density difference exists on the reflection surface.

Moreover, the present invention provides a board capable of automatic inspecting even when setting to a small value the distance between the parts and the device without undergoing the constraints in terms of the mounting intervals of the parts and heights and also causing the errors in the measurement values even when a density difference exists on the reflection surface.

Although the illustrative embodiments of the present invention have been described in detail with reference to the accompanying drawings, it is to be understood that the present invention is limited to those embodiments. Various changes or modifications may be effected by one skilled in the art without departing from the scope or spirit of the invention.

What is claimed is:

1. An inspection method for inspecting posture of parts mounted on a circuit board, said method comprising the steps of:

providing moving means for moving a stage holding the circuit board, a light source for irradiating the parts with a laser beam, an optical system path for irradiating the parts with the laser beam from the light source, a signal output path for outputting a reference signal by the laser beam from the light source, and processing means for processing a signal from each of the optical system path and the signal output path;

obtaining reference signals A and B at first and second positions, respectively, of the parts;

holding the parts in the first position and irradiating the optical system path and the signal output path with the laser beam to detect a signal from each path, and outputting from the processing means a first phase difference signal, corresponding to the first position, of output from each path;

moving the parts to the second position by the moving means;

holding the parts in the second position and irradiating the optical system path and the signal output path with the laser beam to detect a signal from each path, and outputting from the processing means a second phase difference signal, corresponding to the second position, of output from each path; and determining the posture of the parts by comparison of the reference signals A and B, and the first phase difference signal in the first position and the second phase difference signal in the second position, the determination being made using a comparison signal which is a phase difference of the reference signals A and B in the first and second positions and a difference between the first and second phase difference signals in the first and second positions.

2. An inspection method for inspecting the existence or non-existence of parts mounted on a circuit board, said method comprising the steps of:

provide a light source for irradiating the parts with a laser beam, an optical system path for irradiating the parts with the laser beam from the light source, a signal output path for outputting a reference signal by the laser beam from the light source, and processing means for processing a signal from each of the optical system path and the signal output path;

holding the parts in a predetermined position to detect a reference signal by irradiating the parts with the laser beam;

holding the parts in a first position and irradiating the optical system path and the signal output path with the laser beam to detect a signal from each path, and outputting by the processing means a phase difference signal, corresponding to the first position, of output from each path; and determining the existence or non-existence of the parts on the basis of the reference signal and the phase difference signal.

3. An inspection method for inspecting a height posture of parts mounted on a circuit board, said method comprising the steps of:

providing moving means for moving a stage holding the circuit board, a light source for irradiating the parts with a laser beam, an optical system path for irradiating the parts with the laser beam from the light source, a signal output path for outputting a reference signal by the laser beam from the light source, and processing means for processing a signal from each of the optical system path and the signal output path;

obtaining reference signals A' and B' at first and second positions, respectively, of the parts;

holding the parts in the first position and irradiating the optical system path and the signal output path with the laser beam to detect a signal from each path, and outputting from the processing means a phase difference signal, corresponding to the first position, of output from each path to detect a signal representing the height of the parts in the first position;

moving the parts to the second position by the moving means;

holding the parts in the second position and irradiating the optical system path and the signal output path with the laser beam to detect a signal from each path, and outputting from the processing means a phase difference signal, corresponding to the second position, of output from each path to detect a signal representing the height of the parts in the second position; and determining an inclined posture of the parts by comparison of the reference signals A' and B' and the signals representing the height of the parts in the first and second positions.

* * * * *